United States Patent
Shuto

(10) Patent No.: US 10,136,717 B2
(45) Date of Patent: Nov. 27, 2018

(54) WATERPROOF ENCLOSURE

(71) Applicant: ALPS ELECTRIC CO., LTD., Tokyo (JP)

(72) Inventor: Kazuya Shuto, Miyagi (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/632,486

(22) Filed: Jun. 26, 2017

(65) Prior Publication Data

US 2018/0055172 A1    Mar. 1, 2018

(30) Foreign Application Priority Data

Aug. 23, 2016 (JP) .................................. 2016-163003

(51) Int. Cl.
| | |
|---|---|
| *H02G 3/08* | (2006.01) |
| *A45C 13/00* | (2006.01) |
| *B65D 33/16* | (2006.01) |
| *B65D 81/18* | (2006.01) |
| *H04B 1/38* | (2015.01) |

(Continued)

(52) U.S. Cl.
CPC ............ *A45C 13/008* (2013.01); *B65D 33/16* (2013.01); *B65D 81/18* (2013.01); *H04B 1/38* (2013.01); *H05K 5/0213* (2013.01); *A45C 11/00* (2013.01); *A45C 2011/002* (2013.01); *A45C 2011/003* (2013.01); *H04B 2001/3894* (2013.01)

(58) Field of Classification Search
CPC .. H05K 5/06; H05K 5/00; H05K 5/02; H02G 3/08; H02G 3/081; A45C 13/008; A45C 11/00; A45C 2011/002; A45C 2011/003; B65D 33/16; B65D 81/18; H04B 2001/3894

USPC ....... 174/50, 520, 17 VA, 522, 599; 220/3.2, 220/3.3, 4.02; 361/600, 601, 752, 730, 361/728; 439/76.1, 76.2
See application file for complete search history.

(56) References Cited

U.S. PATENT DOCUMENTS

| | | | | |
|---|---|---|---|---|
| 6,095,568 | A * | 8/2000 | Fendt ................... | H05K 5/0213 283/72 |
| 6,144,522 | A * | 11/2000 | Myokan ............... | G11B 25/043 360/97.16 |

(Continued)

FOREIGN PATENT DOCUMENTS

| | | |
|---|---|---|
| JP | 2006-005162 | 1/2006 |
| JP | 4835418 | 12/2011 |
| WO | 2014/108119 | 7/2014 |

OTHER PUBLICATIONS

Extended European Search Report for 17184712.2 dated Jan. 30, 2018.

*Primary Examiner* — Angel R Estrada
(74) *Attorney, Agent, or Firm* — IPUSA, PLLC

(57) ABSTRACT

A waterproof enclosure for enclosing an electronic component includes an outer shell having a penetrating hole formed therethrough, a waterproof filter having air permeability and covering the penetrating hole, and a projecting part projecting from an outer surface of the outer shell and covering the penetrating hole, wherein the projecting part includes a plurality of vent holes connecting the penetrating hole to outside space, and wherein each of the vent holes is delimited by a sloping surface extending at an angle from the outer surface toward the penetrating hole.

9 Claims, 13 Drawing Sheets

(51) Int. Cl.
*H05K 5/02* (2006.01)
*A45C 11/00* (2006.01)

(56) References Cited

U.S. PATENT DOCUMENTS

| | | | | |
|---|---|---|---|---|
| 6,506,110 | B1 * | 1/2003 | Borisch | H05K 5/0213 |
| | | | | 174/17 VA |
| 6,827,232 | B1 * | 12/2004 | Hara | H05K 5/0213 |
| | | | | 220/371 |
| 7,083,660 | B2 * | 8/2006 | Hara | H05K 5/0213 |
| | | | | 55/385.1 |
| 7,253,356 | B2 * | 8/2007 | Kiyota | H02G 3/081 |
| | | | | 174/50 |
| 7,465,887 | B2 * | 12/2008 | Suzuki | H05K 5/0047 |
| | | | | 174/520 |
| 7,667,973 | B2 | 2/2010 | Shinoda et al. | |
| 7,936,566 | B2 * | 5/2011 | Shigyo | H05K 5/0052 |
| | | | | 361/752 |
| 8,699,231 | B2 * | 4/2014 | Shinoda | H05K 5/0047 |
| | | | | 174/520 |
| 8,814,993 | B2 * | 8/2014 | Yano | H05K 5/0213 |
| | | | | 96/4 |
| 9,516,769 | B2 * | 12/2016 | Kaneko | H05K 1/0203 |
| 2003/0094101 | A1 | 5/2003 | Hara et al. | |
| 2013/0055898 | A1 | 3/2013 | Yano | |

* cited by examiner

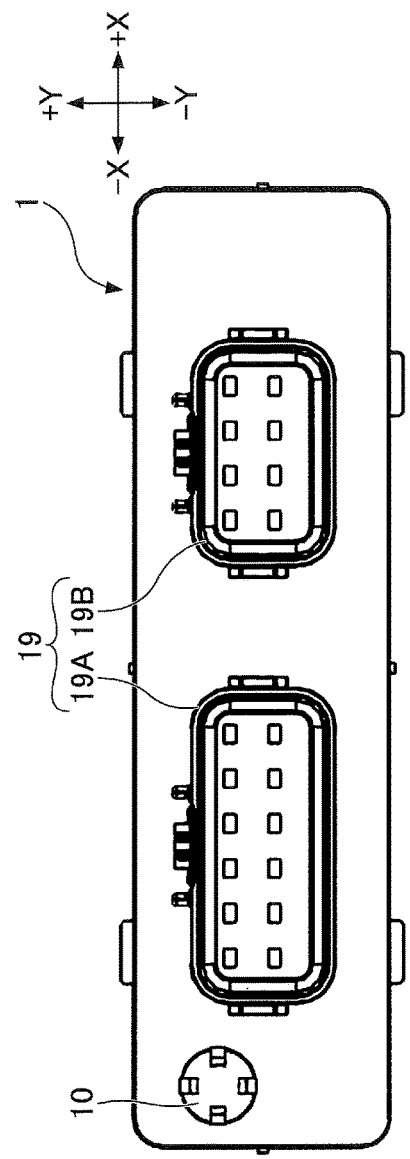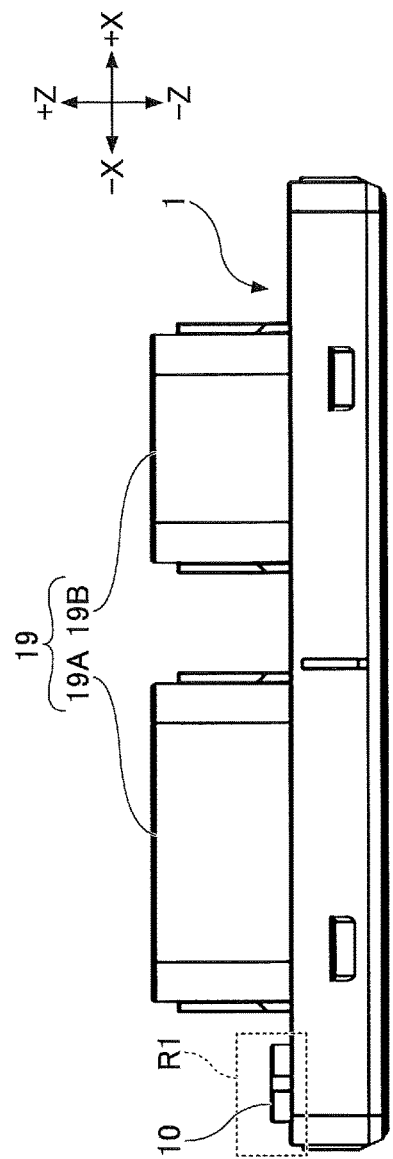
FIG.3A
FIG.3B

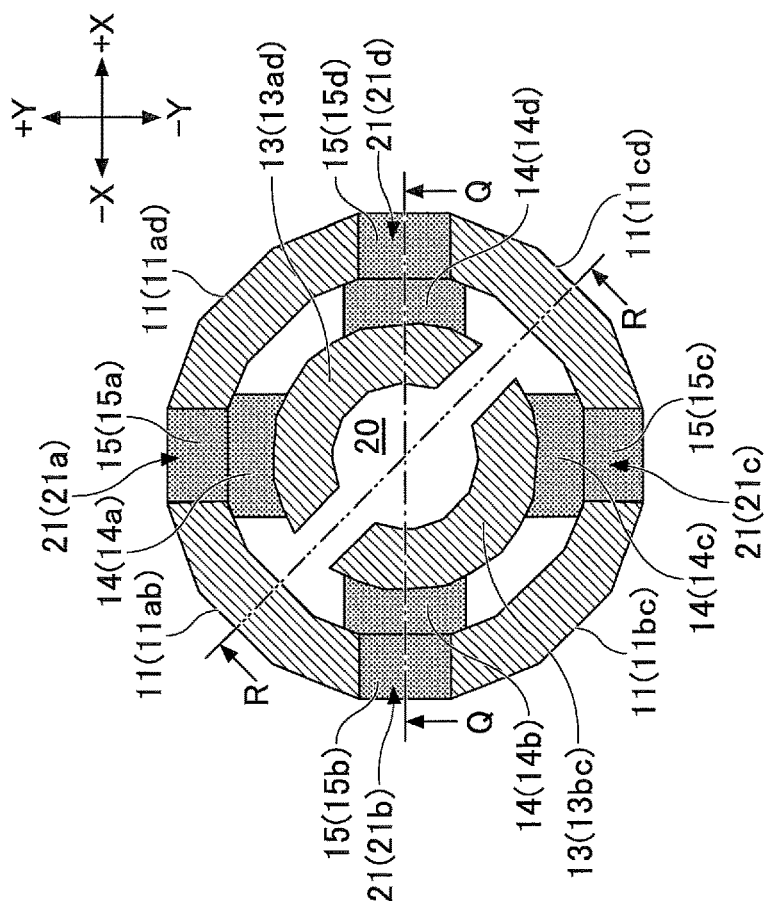
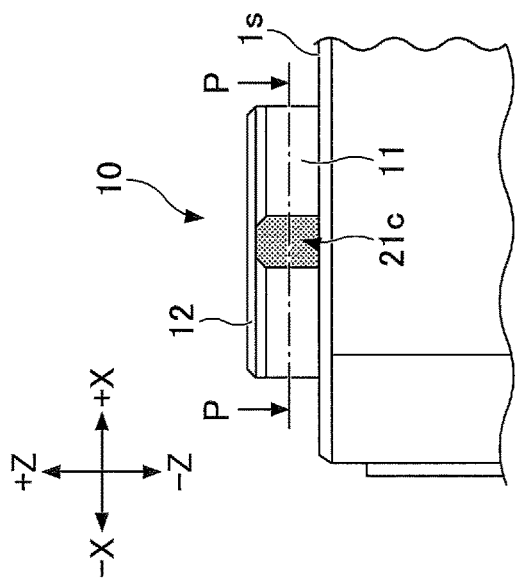

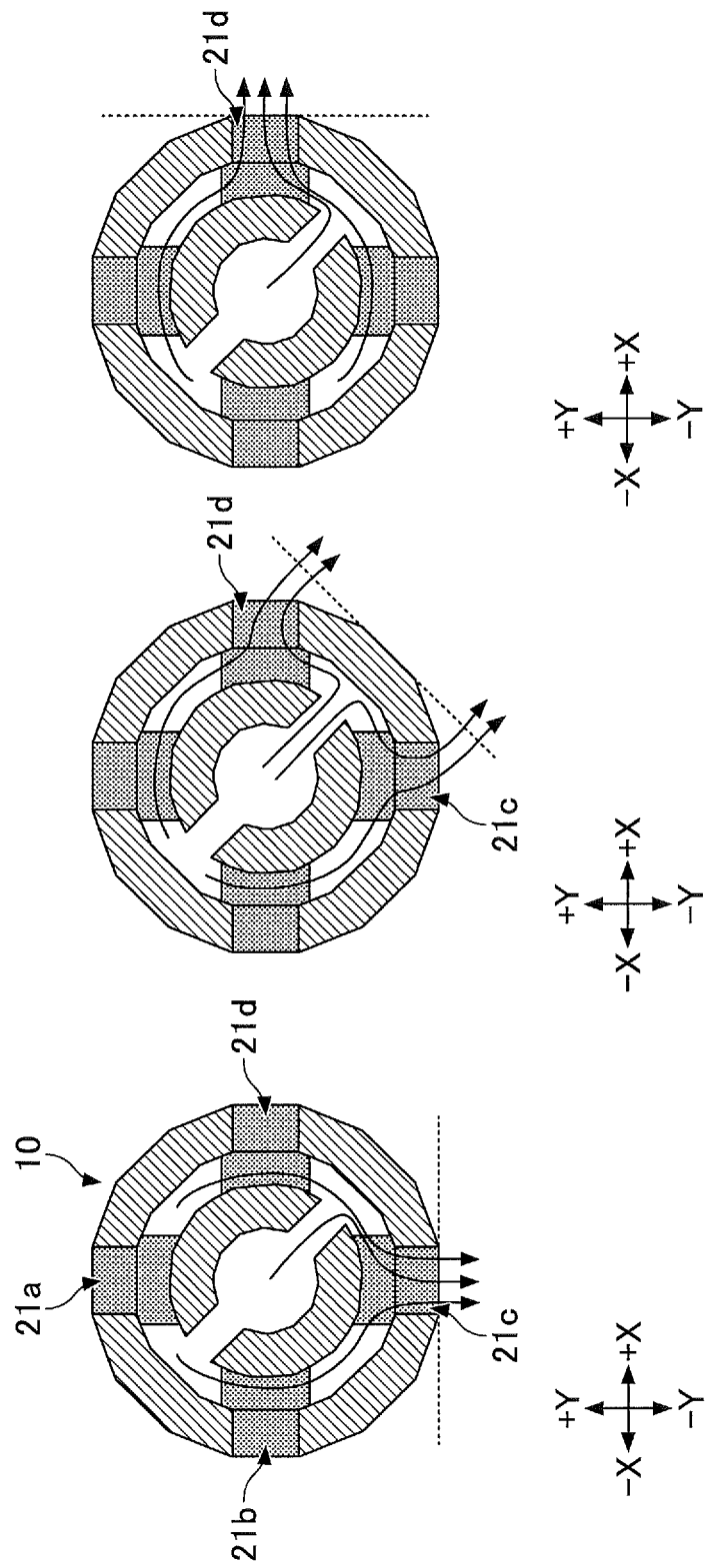

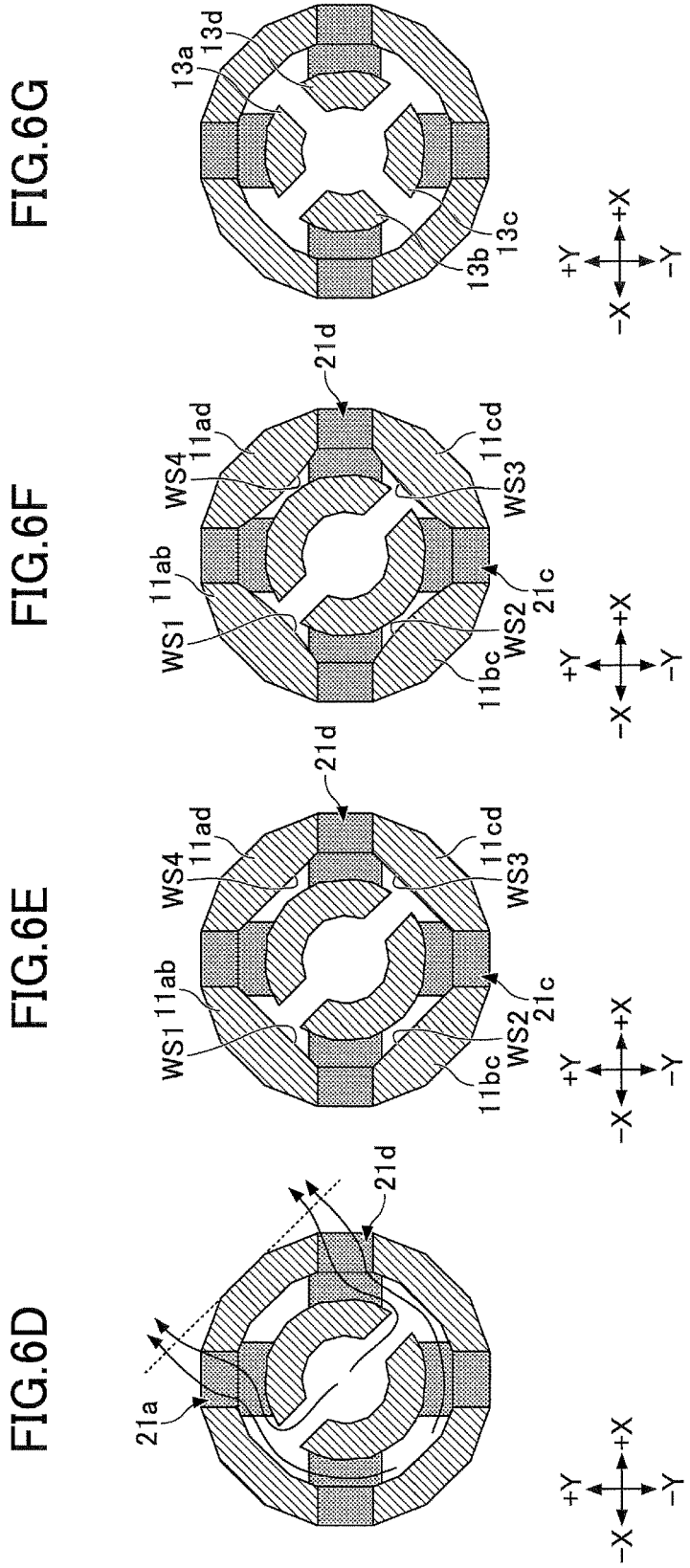

WATERPROOF ENCLOSURE

BACKGROUND OF THE INVENTION

1. Field of the Invention

The disclosures herein relate to a waterproof enclosure for enclosing an electronic component.

2. Description of the Related Art

A waterproof enclosure for enclosing an electronic component is known in the art (for example, see Patent Document 1). Such a waterproof enclosure has a plurality of vent holes formed through its outer case panel and a waterproof filter disposed at the position of the vent holes. This configuration lowers the possibility of all the vent holes being blocked by water when the waterproof enclosure is covered with water.

The waterproof enclosure disclosed in Patent Document 1 has the vent holes extending perpendicularly through the outer case panel. Because of this, water entering the vent holes and attached to the surface of the waterproof filter needs to surpass the height (i.e., width) of the case panel to get out of the vent holes. This structure does not allow water attached to the surface of the waterproof filter to be readily removed.

Accordingly, it may be desired to provide a waterproof enclosure that allows water attached to the surface of a waterproof filter to be readily removed.

RELATED-ART DOCUMENTS

Patent Document

[Patent Document 1] Japanese Patent No. 4835418

SUMMARY OF THE INVENTION

It is a general object of the present invention to provide a waterproof enclosure that substantially obviates one or more problems caused by the limitations and disadvantages of the related art.

According to an embodiment, a waterproof enclosure for enclosing an electronic component includes an outer shell having a penetrating hole formed therethrough, a waterproof filter having air permeability and covering the penetrating hole, and a projecting part projecting from an outer surface of the outer shell and covering the penetrating hole, wherein the projecting part includes a plurality of vent holes connecting the penetrating hole to outside space, and wherein each of the vent holes is delimited by a sloping surface extending at an angle from the outer surface toward the penetrating hole.

According to at least one embodiment, a waterproof enclosure is provided that allows water attached to the surface of a waterproof filter to be readily removed.

BRIEF DESCRIPTION OF THE DRAWINGS

Other objects and further features of the present invention will be apparent from the following detailed description when read in conjunction with the accompanying drawings, in which:

FIGS. 3A through 3D are views of a cover of the waterproof enclosure illustrated in FIG. 1 taken from different directions;

FIGS. 4A through 4F are views of a projecting part of the cover illustrated in FIG. 3 taken from different directions;

FIGS. 6A through 6G are drawings illustrating the results achieved by four vent holes of the projecting part illustrated in FIGS. 4A through 4F;

DESCRIPTION OF THE PREFERRED EMBODIMENTS

Figure 1:
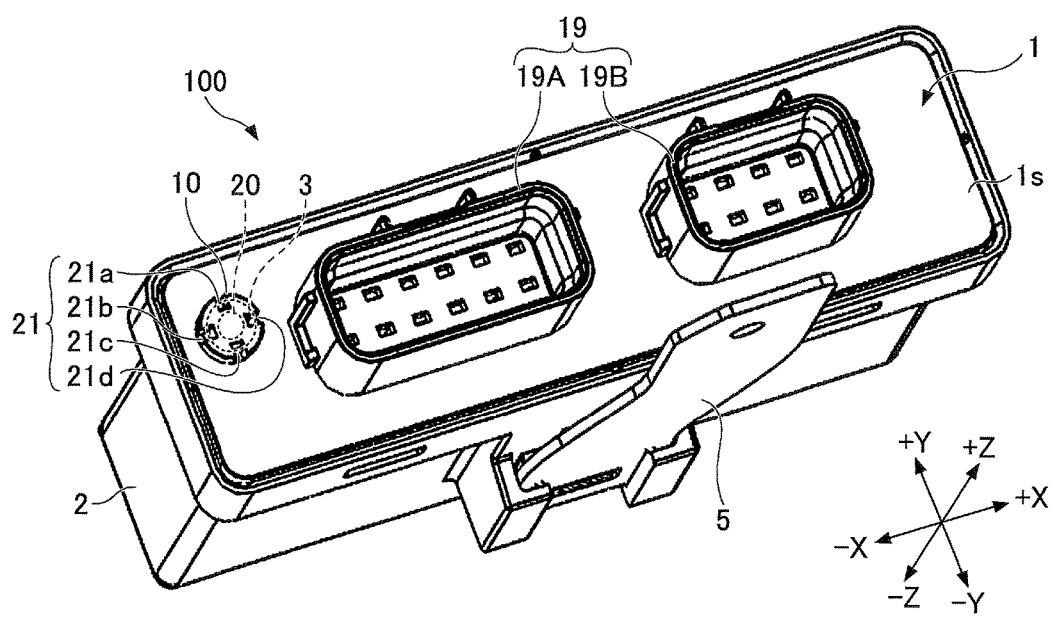
FIG. 1 is an axonometric view of a waterproof enclosure according to an embodiment.
Figure 2:
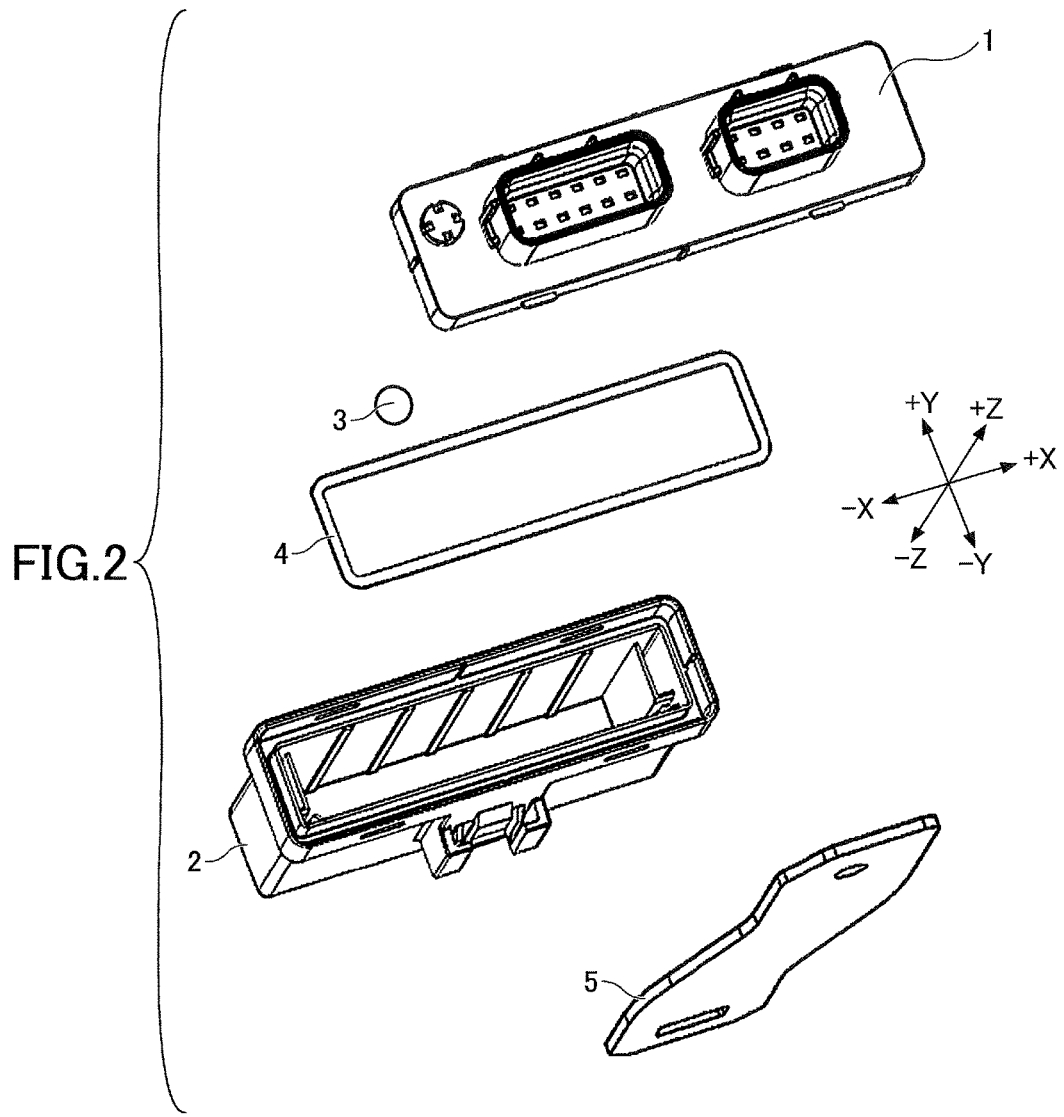
FIG. 2 is an exploded axonometric view of the waterproof enclosure illustrated in FIG. 1.

FIG. 1 is an axonometric view of a waterproof enclosure 100 according to an embodiment of the present invention. FIG. 2 is an exploded axonometric view of the waterproof enclosure 100.

The waterproof enclosure 100 encloses a printed circuit board on which a plurality of electronic components are mounted. In an example illustrated in FIG. 1, the waterproof enclosure 100 serves to enclose a communication apparatus for use in a smart key system for two wheel vehicles, and includes a cover 1, a case 2, a waterproof filter 3, and a seal 4. The waterproof enclosure 100 may be attached to the bottom of the seat of a two wheel vehicle via a stay 5, for example.

The cover 1 is a member constituting the outer shell of the waterproof enclosure 100. In the example illustrated in FIG. 1, the cover 1 is made of resin and formed by injection molding. The cover 1 may alternatively be made of different material. The cover 1 includes a projecting part 10 and an interface part 19 as part thereof. Alternatively, at least one of the projecting part 10 and the interface part 19 may be formed as a separate part, which may be attached to the cover 1 through adhesive or the like.

The projecting part 10 projects in the positive Z direction from an outer face 1s (i.e., the face on the positive Z side) of the cover 1 to cover a penetrating hole 20. The penetrating hole 20 is formed through the cover 1.

The projecting part 10 has a plurality of vent holes 21 that connect the penetrating hole 20 to outside space. In the example illustrated in FIG. 1, the projecting part 10 has four vent holes 21a through 21d facing outwardly in a radial manner from the center of the projecting part 10 in directions along the outer face 1s. The four vent holes 21a through 21d, which face outwardly in a Greek-cross-shaped arrangement from the center of the projecting part 10 along the outer face 1s of the cover 1, are disposed at equal angular intervals (90-degree intervals) on the circumference. Alternatively, two vent holes 21 may be disposed at 180-degree intervals on the circumference, or three vent holes 21 may be disposed at 120-degree intervals on the circumference. Alternatively, the projecting part 10 may have five or more vent holes 21 disposed at equal angular intervals on the circumference thereof. The vent holes 21 do not have to be disposed at equal angular intervals as long as their circumferential arrangement is not unbalanced. In the example illustrated in FIG. 1, the direction of each arm of the Greek-cross shape is perpendicular to a corresponding one of the four sides of the substantially rectangular outer face is of the cover 1, but may alternatively be disposed at an angle relative to the corresponding one of the four sides. With the provision of the vent holes 21 in such an arrangement, the projecting part 10 may have a reduced risk of clogging caused by water, dust, etc.

The interface part 19 is a structure for connecting an external apparatus. In the example illustrated in FIG. 1, the interface part 19 includes two interface parts 19A and 19B. Each of the interface parts 19A and 19B forms the outer frame of a receptacle to which a plug having a socket contact is coupled. The area enclosed by the outer frame has a plurality of holes that receive pin contacts connected to a printed circuit board enclosed inside the waterproof enclosure 100. The interface part 19 is hermetically sealed by connecting the plugs thereto. The interface part 19 may alternatively constitute part of another connector structure different from receptacles. The interface part 19 may be omitted.

The case 2 is a member constituting the outer shell of the waterproof enclosure 100. In the example illustrated in FIG. 1, the case 2 is made of resin and formed by injection molding, similarly to the cover 1. The case 2 may alternatively be made of different material. The case 2 has a communication apparatus enclosed therein that includes a printed circuit board on which a plurality of electronic components are mounted.

The waterproof filter 3 is a sheet member that allows the passage of air, but does not allow the passage of water. Air inside the waterproof enclosure 100 may escape to the outside through the waterproof filter 3, the penetrating hole 20, and the vent holes 21 when the atmospheric pressure of inside air becomes higher than the outside atmospheric pressure due to a temperature change, for example. This results in the atmospheric pressure inside the waterproof enclosure 100 becoming equal to the outside atmospheric pressure. Air outside the waterproof enclosure 100 may enter the waterproof enclosure 100 through the vent holes 21, the penetrating hole 20, and the waterproof filter 21 when the atmospheric pressure of outside air becomes higher than the atmospheric pressure inside the waterproof enclosure 100 due to a temperature change, for example. This also results in the atmospheric pressure inside the waterproof enclosure 100 becoming equal to the outside atmospheric pressure. In this manner, the waterproof filter 3, the penetrating hole 20, and the vent holes 21 operate together to provide a pressure adjustment function by which the atmospheric pressure inside the waterproof enclosure 100 is adjusted to become equal to the outside atmospheric pressure. The waterproof filter 3, the penetrating hole 20, and the vent holes 21 constitute an atmospheric pressure adjustment part for adjusting atmospheric pressure inside the waterproof enclosure 100.

Water intruding into the projecting part 10 from the outside through the vent holes 21 is blocked by the waterproof filter 3, thereby not entering the inside of the waterproof enclosure 100. However, water intruding into the projecting part 10 may cover the surface of the waterproof filter 3 to block the waterproof filter 3, thereby reducing the air permeability of the waterproof filter 3. It is thus preferable to remove the water having intruded into the projecting part 10 as soon as possible. The waterproof enclosure 100 utilizes the features as will be described later to ensure that the water having intruded into the projecting part 10 be promptly removed.

The seal 4 is a member serving to prevent rain water, dust, and the like from entering the inside of the waterproof enclosure 100 through a gap between the cover 1 and the case 2. In the example illustrated in FIG. 1, the seal 4 is made of a rectangular rubber frame, which is disposed between the cover 1 and the case 2.

Figure 3C:
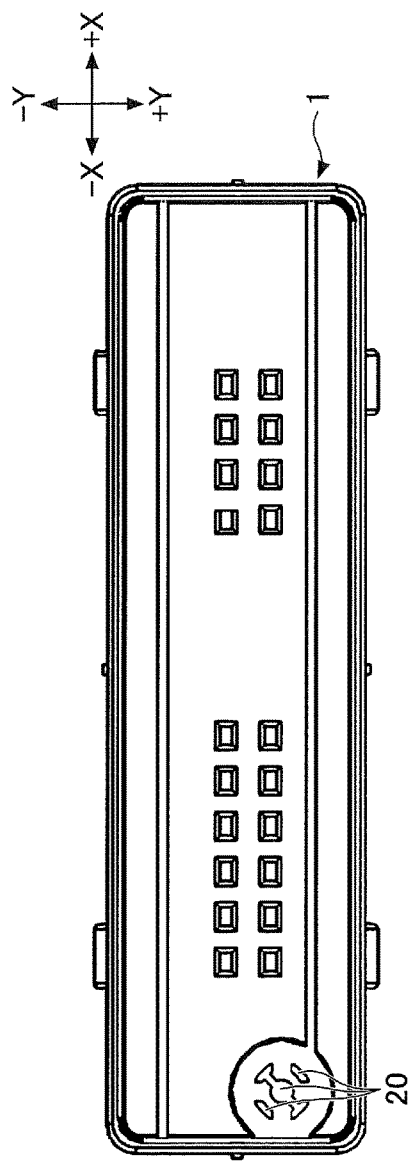
Figure 3D:
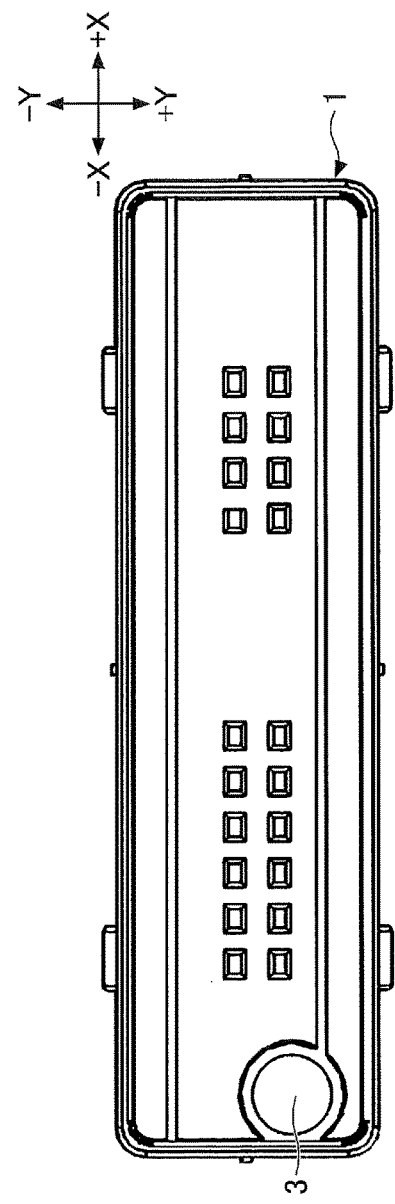

FIGS. 3A through 3D are views of the cover 1 taken from different directions. FIG. 3A is a top view of the cover 1 taken from the positive Z direction. FIG. 3B is a side elevation view of the cover 1 taken from the negative Y direction. FIG. 3C and FIG. 3D are bottom views of the cover 1 taken from the negative Z direction. FIG. 3D illustrates the cover 1 to which the waterproof filter 3 is attached on the inside face (i.e., negative Z side) thereof to cover the penetrating hole 20. In the example illustrated in FIG. 3D, the waterproof filter 3 is a circular shape, but may alternatively be any shape such as a rectangular shape, an elliptical shape, or the like.

Figure 4D:
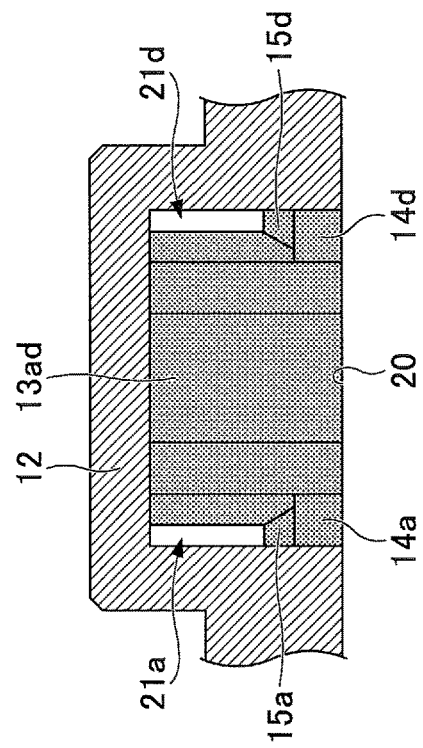
Figure 4C:
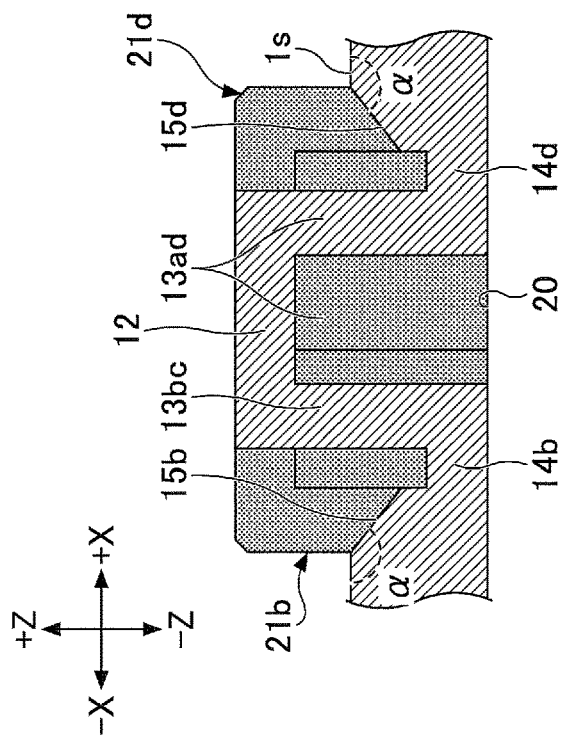
Figure 4E:
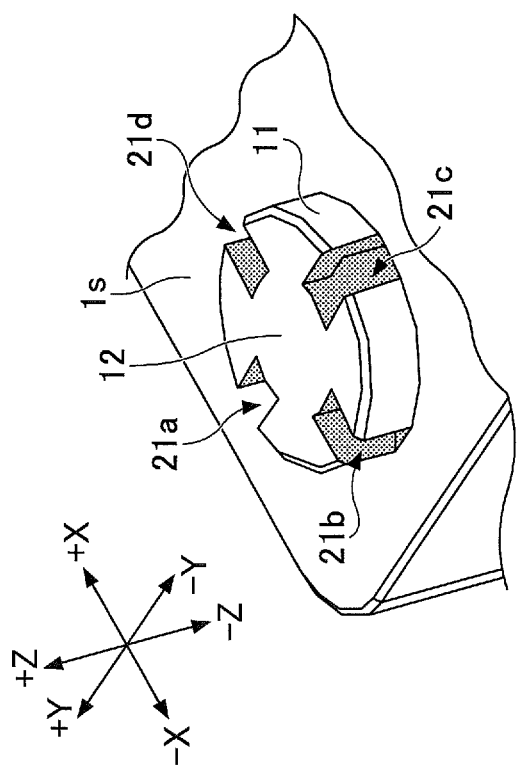
Figure 4F:
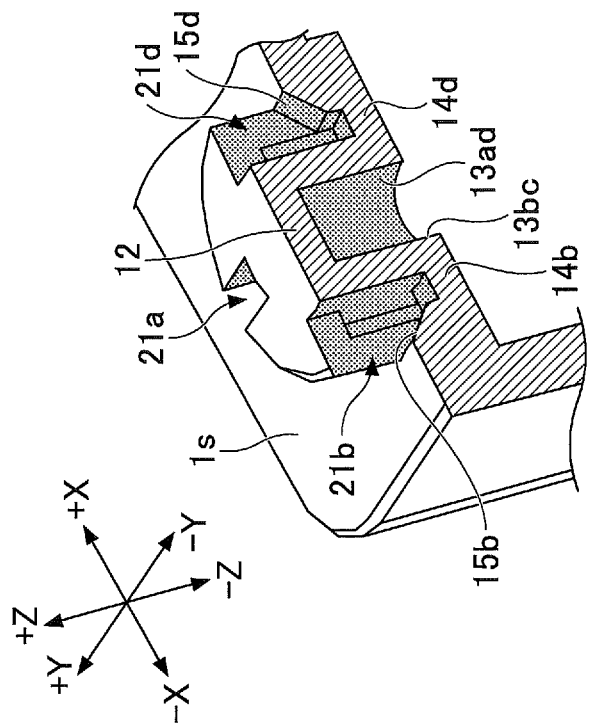

In the following, the details of the projecting part 10 will be described by referring to FIGS. 4A through 4F. FIGS. 4A through 4F are views of the projecting part 10 taken from different directions. FIG. 4A is an enlarged view of an area R1 enclosed in dotted lines in FIG. 3B. FIG. 4B is a view of a cross-section taken along the dot and dash line in FIG. 4A as viewed from the direction indicated by arrows P. FIG. 4C is a view of a cross-section taken along the dot and dash line in FIG. 4B as viewed from the direction indicated by arrows Q. FIG. 4D is a view of a cross-section taken along the double-dot and dash line in FIG. 4B as viewed from the direction indicated by arrows R. FIG. 4E is an axonometric view of the projecting part 10 as viewed from above at an angle. FIG. 4F is a cross-sectional view of the projecting part 10 taken along a plane passing through the center of the projecting part 10 and extending in parallel to the X-Z plane. The hatched areas appearing in FIG. 4B through FIG. 4D and FIG. 4F indicate areas constituting the cross-sections.

The projecting part 10 has an outer circumferential part 11, a top part 12, an inner circumferential part 13, cover parts 14, and sloping surface parts 15. The vent holes 21 are formed by removing portions of the outer circumferential part 11 and portions of the top part 12.

The outer circumferential part 11 constitutes an outer circumference of the projecting part 10. The outer circumferential part 11 is substantially an annular cylindrical shape, which extends from the outer face 1s of the cover 1 in the positive Z direction. Specifically, the outer circumferential part 11 includes an outer circumferential part 11ab situated between the vent hole 21a and the vent hole 21b, an outer circumferential part 11bc situated between the vent hole 21b and the vent hole 21c, an outer circumferential part 11cd situated between the vent hole 21c and the vent hole 21d, and an outer circumferential part 11ad situated between the vent hole 21a and the vent hole 21d, as illustrated in FIG. 4B.

The top part 12 constitutes the upper end of the projecting part 10. The top part 12 is substantially a circular plate shape, which covers the end of the outer circumferential part 11 on the positive Z side.

The inner circumferential part 13 partitions the inner space of the projecting part 10. The inner circumferential part 13 is substantially an annular cylindrical shape, which extends from the inner face (i.e., face on the negative Z side) of the top part 12 in the negative Z direction in parallel to the outer circumferential part 11. Specifically, the inner circumferential part 13 includes an inner circumferential part 13ad facing both the vent hole 21a and the vent hole 21d and an inner circumferential part 13bc facing both the vent hole 21b and the vent hole 21c, as illustrated in FIG. 4B. Passages are formed between the ends of the inner circumferential part 13ad and the ends of the inner circumferential part 13bc to connect the inner space of the inner circumferential part 13 to the outer space thereof. Alternatively, one of the two passages may not be provided. For example, the end of the inner circumferential part 13ad situated toward the negative X side may be connected to the end of the inner circumferential part 13bc situated toward to positive Y side. Alternatively, the entirety of the inner circumferential part 13 may be omitted.

The cover parts 14 are disposed between the vent holes 21 and the waterproof filter 3 to cover part of the surface of the waterproof filter 3 (i.e., the surface facing toward the positive Z side). The cover parts 14, which are substantially a flat plate bar, extend from the lower end (i.e., the end toward the negative Z side) of the inner circumferential part 13 in the directions in which the vent holes 21 face, respectively. Specifically, the cover parts 14 includes a cover part 14a extending from the inner circumferential part 13ad in the direction in which the vent hole 21a faces, a cover part 14b extending from the inner circumferential part 13bc in the direction in which the vent hole 21b faces, a cover part 14c extending from the inner circumferential part 13bc in the direction in which the vent hole 21c faces, and a cover part 14d extending from the inner circumferential part 13ad in the direction in which the vent hole 21d faces, as illustrated in FIG. 4B. The cover parts 14 cover part of the waterproof filter 3 to protect the waterproof filter 3. Alternatively, the cover parts 14 may not be provided.

The sloping surface parts 15 delimit the vent holes 21. Each of the sloping surface parts 15 has a slope extending at an angle from the outer face 1s of the cover 1 toward the penetrating hole 20. Specifically, the sloping surface parts 15 include sloping surface parts 15a through 15d corresponding to the vent holes 21a through 21d, respectively.

The vent hole 21d is delimited by the sloping surface part 15d extending at an angle α relative to the outer face 1s of the cover 1 from the outer face 1s toward the penetrating hole 20, as is most clearly illustrated in FIG. 4C. The angle α is an obtuse angle, and may range between 135 degrees and 150 degrees, for example. The sloping surface part 15d may have a sloping flat surface or a sloping curved surface. In the case of a sloping curved surface, the angle α is an angle between the outer face 1s and a tangent plane to the sloping curved surface. Although the example illustrated in FIG. 4C has a step between the cover part 14d and the sloping surface part 15d, the cover part 14d and the sloping surface part 15d may be continuously connected to each other without an intervening step. The same also applies to the sloping surface parts 15a through 15c corresponding to the vent holes 21a through 21c, respectively.

Figure 5A:
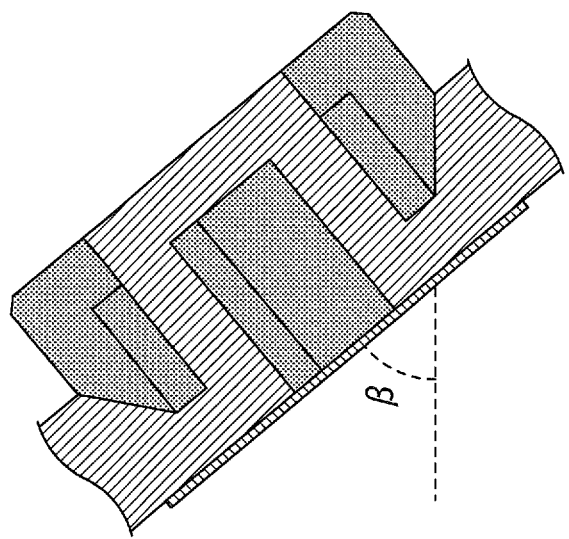
FIGS. 5A through 5D are drawings illustrating the function of a sloping surface part of the projecting part illustrated in FIGS. 4A through 4F.
Figure 5B:
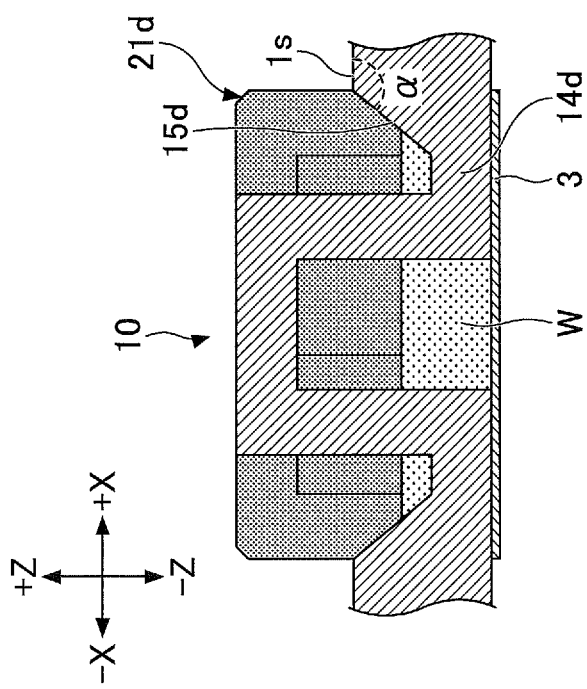

In the following, the function of the sloping surface parts 15 will be described with reference to FIGS. 5A through 5B. FIG. 5A and FIG. 5B are cross-sectional views of the projecting part 10, which correspond to the view shown in FIG. 4C. Specifically, the projecting part 10 illustrated in FIG. 5A and FIG. 5B has the sloping surface part 15d including a sloping flat surface extending at an angle α relative to the outer face 1s of the cover 1. The cover part 14d and the sloping surface part 15d are connected continuously to each other without an intervening step. FIG. 5A illustrates the state in which the projecting part 10 is placed to stand upright (i.e., aligned in the positive Z direction) with water W being accumulated therein. FIG. 5B illustrates the state in which the projecting part is tilted at an angle β around the Y axis from the position illustrated in FIG. 5A, resulting in the water W flowing out to the outside. The angle β may be the angle obtained by subtracting the angle α from 180 degrees, for example.

Figure 5C:
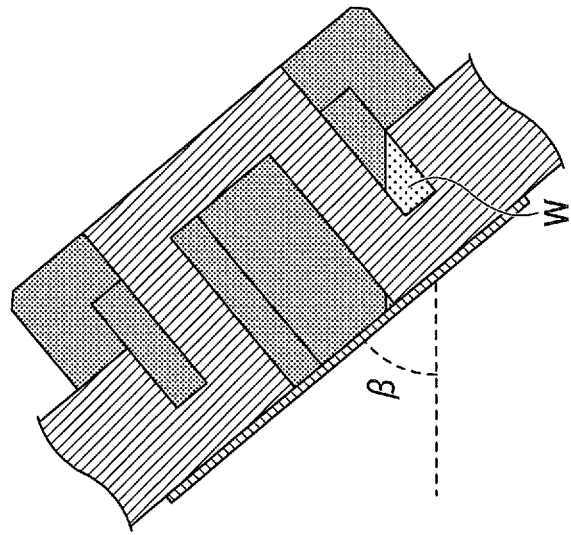
Figure 5D:
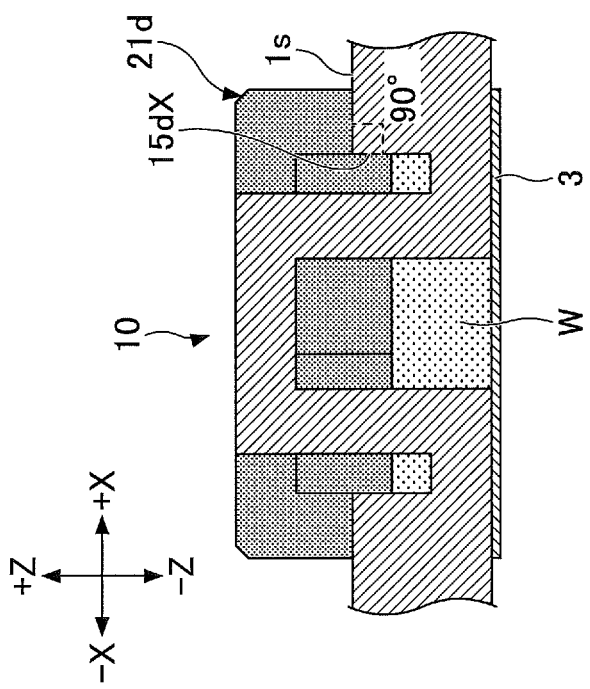

The projecting part 10 illustrated in FIG. 5C and FIG. 5D, which are directed to a comparative example, has a vertical surface part 15dX including a vertical surface extending at 90 degrees relative to the outer face 1s of the cover 1. Similarly to FIG. 5A, FIG. 5C illustrates the state in which the projecting part 10 is placed to stand upright (i.e., aligned in the positive Z direction) with water W being accumulated therein. Similarly to FIG. 5B, FIG. 5D illustrates the state in which the projecting part 10 is tilted at an angle β around the Y axis from the position illustrated in FIG. 5C, with the accumulated water W still remaining in the inside.

In this manner, the sloping surface part 15d allows the water W accumulated inside the projecting part 10 to be discharged to the outside, with a smaller tilt angle than in the case of the vertical surface part 15dX. The same also applies in the case of the sloping surface parts 15a through 15c. Accordingly, the waterproof enclosure 100 having the projecting part 10 with the sloping surface parts 15, which may be attached to a two wheel vehicle such that the projecting part 10 stands upright when the two wheel vehicle stands upright, allows water accumulated inside the projecting part 10 to be discharged to the outside upon the two wheel vehicle being tilted at the angle β or more in any direction. Such a tilt at the angle β may be brought about through routine use of the two wheel vehicle running on a sloped road, running along a curve, being parked by use of a side stand, etc. It may further be noted that the position in which the projecting part 10 stands upright is the most likely position to allow water to be accumulated on the waterproof filter 3. Because of this, water accumulated inside the projecting part is properly discharged to the outside through routine use of a two wheel vehicle regardless of the position in which the waterproof enclosure 100 is attached to the two wheel vehicle. Clogging of the waterproof filter 3 to obstruct air passage can thus be prevented.

The cover parts 14 do not have a sloping surface in the example described above. Alternatively, the cover parts 14 may have a sloping surface that smoothly continues from the sloping surface of the sloping surface parts 15. Moreover, the end faces of each outer circumferential part 11 may have a slope (i.e., bevel) or a curve (i.e., round chamfer) on the inner side thereof so as to facilitate the flowing out of water accumulated inside the projecting part 10 upon the waterproof enclosure 100 being tilted. The same also applies to the end faces of each inner circumferential part 13 and the end faces of the cover parts 14.

In the following, a description will be given of the results achieved by the four vent holes 21a through 21d facing outwardly in a radial manner by referring to FIG. 6. FIGS. 6A through 6G are cross-sectional views of the projecting part 10, which correspond to the view shown in FIG. 4B. Dotted lines in FIGS. 6A through 6D indicate the lowest point of the projecting part 10. Solid line arrows indicate the flow of water observed when water accumulated inside the projecting part 10 flows to the outside. FIGS. 6E through 6G illustrate variations of the projecting part 10.

As illustrated in FIG. 6A, tilting the two wheel vehicle such as to place the vent hole 21c at the lowest point causes water accumulated inside the projecting part 10 to be discharged to the outside through the vent hole 21c.

As illustrated in FIG. 6B, tilting the two wheel vehicle such as to place the midpoint between the vent hole 21c and the vent hole 21d at the lowest point causes water accumulated inside the projecting part 10 to be discharged to the outside through the vent hole 21c and the vent hole 21d.

As illustrated in FIG. 6C, tilting the two wheel vehicle such as to place the vent hole 21d at the lowest point causes water accumulated inside the projecting part 10 to be discharged to the outside through the vent hole 21d.

As illustrated in FIG. 6D, tilting the two wheel vehicle such as to place the midpoint between the vent hole 21a and the vent hole 21d at the lowest point causes water accumulated inside the projecting part 10 to be discharged to the outside through the vent hole 21a and the vent hole 21d.

As described above, the four vent holes 21a through 21d facing outwardly in a radial manner allow water accumulated inside the projecting part 10 to escape to the outside through one or two of the four vent holes 21a through 21d regardless of the direction in which the two wheel vehicle tilts. Because of this, water accumulated inside the projecting part 10 is properly discharged to the outside through routine use of a two wheel vehicle regardless of the position in which the waterproof enclosure 100 is attached to the two wheel vehicle.

The projecting part 10 may be configured such that an inner wall WS3 of the outer circumferential part 11cd forms a straight line between the vent hole 21c and the vent hole 21d, as illustrated in FIG. 6E. This arrangement is for the purpose of reliably discharging water accumulated inside the projecting part 10 to the outside even when the two wheel vehicle is tilted to place the midpoint between these two vent holes at the lowest position as illustrated in FIG. 6B. Namely, this arrangement is made in order to prevent water from staying on the inner wall of the outer circumferential part 11cd. For the same reason, the inner wall WS3 may be configured to have a curved surface bulging toward the center of the projecting part 10 between the vent hole 21c and the vent hole 21d, as illustrated in FIG. 6F. The same applies to respective inner walls WS1, WS2, and WS4 of the remaining outer circumferential parts 11ab, 11bc, and 11ad.

The projecting part 10 may be configured such that the respective sections of the inner circumferential part 13 face the vent holes 21a through 21d as illustrated in FIG. 6G. This arrangement is for the purpose of reliably discharging water accumulated inside the projecting part 10 to the outside even when the two wheel vehicle is tilted to place the midpoint between these two vent holes at the lowest position as illustrated in FIG. 6D. Namely, this arrangement is made in order to prevent water from staying on the inner walls of the inner circumferential part 13. Specifically, the inner circumferential part 13 includes the four inner circumferential parts 13a through 13d facing the four vent holes 21a through 21d, respectively, with passages being formed between any two adjacent parts among these four inner circumferential parts. The configuration and features illustrated in FIG. 6G may be combined with the configuration and features illustrated in FIG. 6E or FIG. 6G.

The results achieved by the four vent holes 21a through 21d described in connection with FIGS. 6A through 6G may similarly be achieved by two vent holes arranged at 180-degree intervals on the circumference, three vent holes arranged at 120-degree intervals on the circumference, or five or more vent holes arranged at equal angular intervals on the circumference. Further, the configurations and features illustrated in FIGS. 6E through 6G may also be applicable in the cases in which the projecting part 10 has two, three, or five or more vent holes.

Figure 7A:
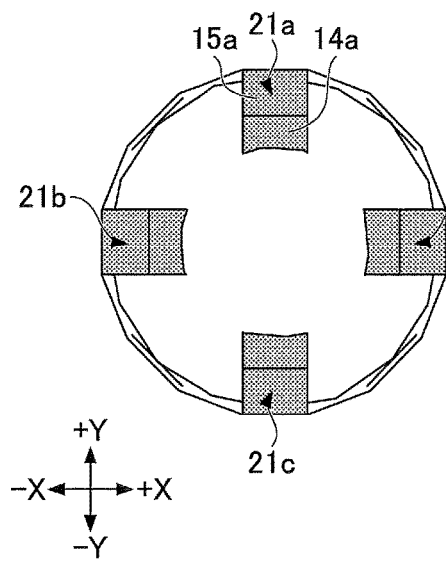
FIGS. 7A through 7F are drawings illustrating the function of a cover part of the projecting part illustrated in FIGS. 4A through 4F.
Figure 7B:
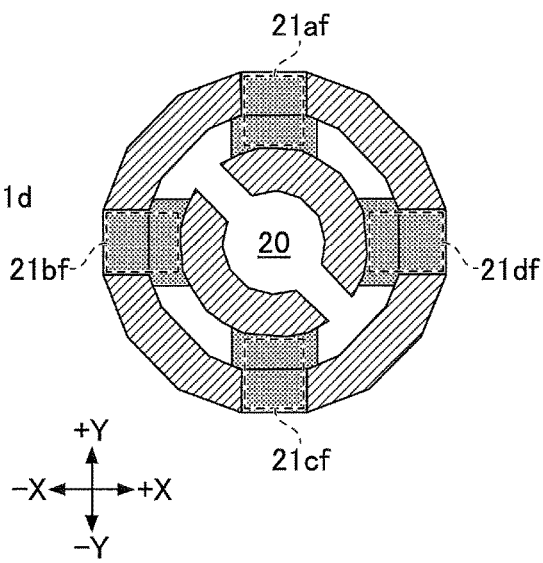
Figure 7C:
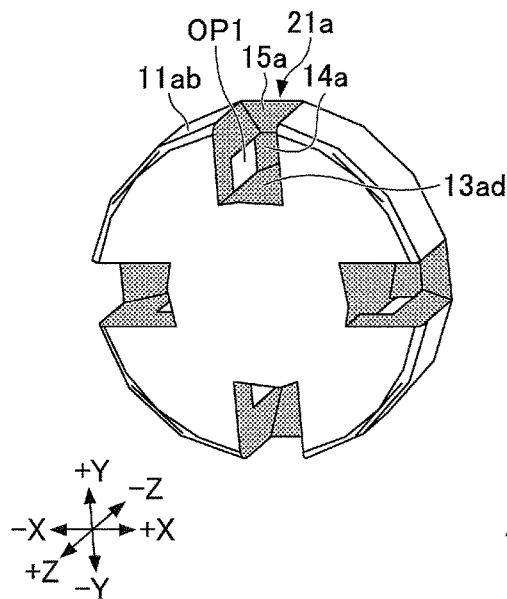
Figure 7D:
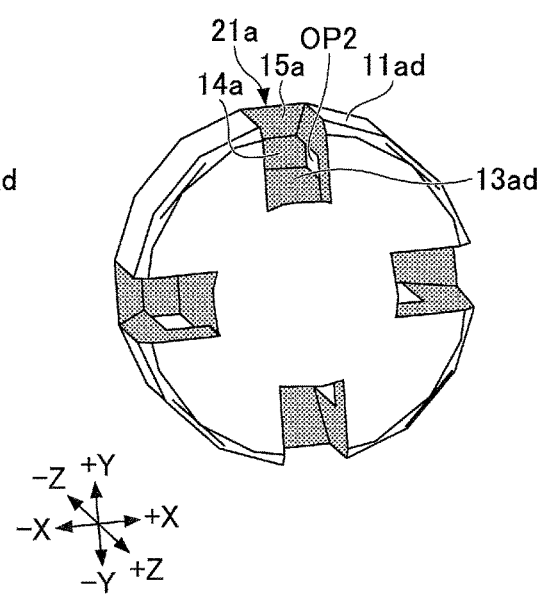
Figure 7E:
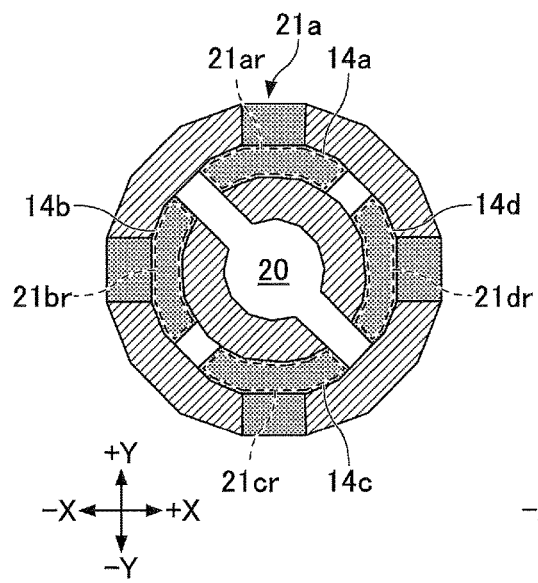
Figure 7F:
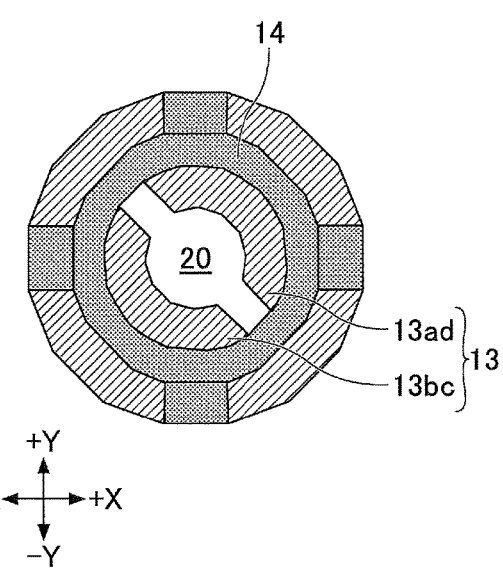

In the following, the function of the cover parts 14 will be explained by referring to FIGS. 7A through 7F. FIGS. 7A through 7F are views of the projecting part 10 taken from different directions. Specifically, FIG. 7A is a top view of the projecting part 10 as viewed from directly above (from the positive Z side). FIGS. 7B, 7E, and 7F are cross-sectional views corresponding to the view of FIG. 4B. FIG. 7C and FIG. 7D are axonometric views. FIGS. 7E and 7F illustrate variations of the cover parts 14.

As illustrated in FIG. 7A, the projecting part 10 as viewed from directly above shows neither the waterproof filter 3 nor the penetrating hole 20 through the vent holes 21. This is because the waterproof filter 3 and the penetrating hole 20 are covered with the cover parts 14.

Specifically, coverage by the cover parts 14 encompasses the orthogonal projection of the vent holes 21 onto the horizontal plane as illustrated in FIG. 7B. An area 21af shown in dotted lines in FIG. 7B indicate the orthogonal projection of the mouth of the vent hole 21a onto the surface of the waterproof filter 3. Similarly, areas 21bf through 21df indicate the orthogonal projections of the mouths of the vent holes 21b through 21d, respectively, onto the surface of the waterproof filter 3.

In this manner, coverage provided by the cover part 14a includes a point at which an imaginary line perpendicular to the waterproof filter 3 and passing through the mouth of the vent hole 21a would intersect directly with the surface of the waterproof filter 3. Namely, the provision of the cover part 14a prevents an imaginary line perpendicular to the waterproof filter 3 from passing through the mouth of the vent hole 21a to intersect directly with the surface of the waterproof filter 3. The same also applies to the cover parts 14b through 14d. Here, the phrase "intersect directly with" means that an imaginary line intersects the surface of the waterproof filter 3 without being blocked by a member different from the waterproof filter 3.

As illustrated in FIGS. 7C and 7D, the waterproof filter 3 is hard to see from the outside even when the projecting part 10 is viewed from above at an angle. This is because each of the vent holes 21 is connected to the penetrating hole 20 only through the two passages facing each other and formed between the outer circumferential part 11 and the inner circumferential part 13 of the projecting part 10.

Specifically, the vent hole 21a is connected to the penetrating hole 20 through a passage OP1 formed between the outer circumferential part 11ab and the inner circumferential part 13ad and through a passage OP2 formed between the outer circumferential part 11ad and the inner circumferential part 13ad. The passage OP1 and the passage OP2 are situated to face each other. Namely, the passage OP1 is formed toward the negative X side relative to the cover part 14a, and the passage OP2 is formed toward the positive X side relative to the cover part 14a. The same also applies to the vent holes 21b through 21d. With this arrangement, water, dust, or the like intruding into the vent holes 21 is not able to reach the waterproof filter 3 unless the travel direction thereof changes. Namely, the projecting part 10 having the passages OP1 and OP2 does not allow foreign material such as water, dust, or the like to readily reach the waterproof filter 3.

In the case of a straight line object such as a needle or the like intruding into the vent holes 21, the inner circumferential part 13 and the cover parts 14 prevent, or reduce the likelihood of, the contact of such an object with the waterproof filter 3. When foreign material intrudes into the vent holes 21 at the time of attaching the waterproof enclosure 100 to a two wheel vehicle, or when foreign material is maliciously inserted into the vent holes 21, for example, such foreign material is prevented from coming, or readily coming, in contact with the waterproof filter 3. Physical impact on and/or tearing of the waterproof filter 3 can thus be avoided.

The coverage provided by the cover part 14a may include all the possible points at which imaginary lines passing through the mouth of the vent hole 21a could intersect directly with the surface of the waterproof filter 3 as illustrated in FIG. 7E. Namely, the cover part 14a may be configured such that any imaginary line passing through the mouth of the vent hole 21a does not intersect directly with the surface of the waterproof filter 3. The same also applies to the cover parts 14b through 14d. Areas 21ar through 21dr illustrated in dotted lines in FIG. 7E indicate the ranges within which imaginary lines passing through the mouths of the vent holes 21a through 21d would possibly intersect directly with the surface of the waterproof filter 3. Alternatively, the coverage provided by the cover parts 14 may be configured such that the cover parts 14 cover all the surface of the waterproof filter 3 situated outside the inner circumferential part 13, as illustrated in FIG. 7F. With such arrangements, physical impact on and/or tearing of the waterproof filter 3 can be avoided with increased reliability.

Figure 8:
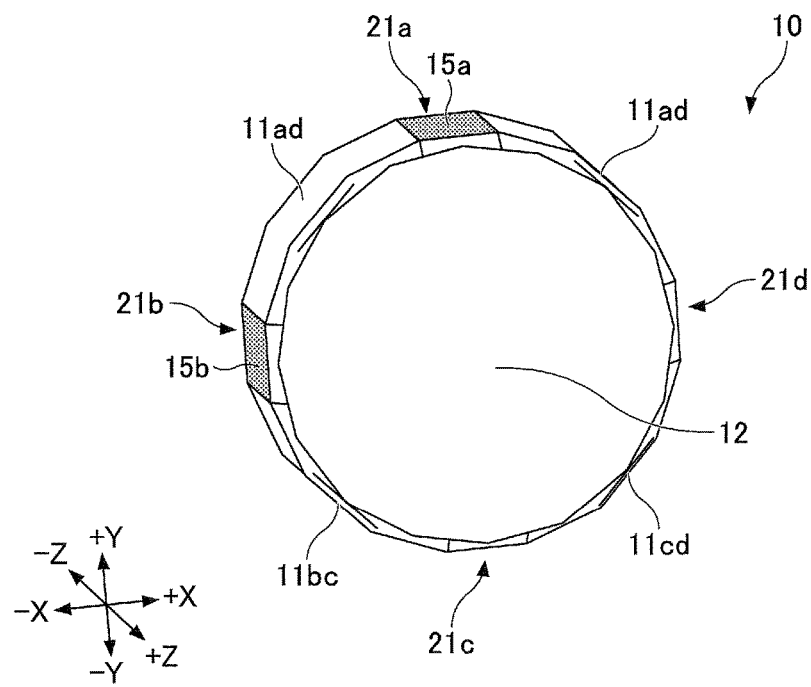
FIG. 8 is a drawing illustrating a variation of the projecting part.

In the following, a variation of the projecting part 10 will be described by referring to FIG. 8. FIG. 8 is an axonometric view of the projecting part 10 corresponding to the view of FIG. 7D. The projecting part 10 illustrated in FIG. 8 differs from the projecting part 10 as described above in connection with FIG. 7D in that the surface of the top part 12 (i.e., the surface facing toward the positive Z side) has no mouths of the vent holes 21. Namely, the projecting part 10 illustrated in FIG. 8 has four vent holes 21a through 21d having the mouths thereof only in the lateral surface of the outer circumferential part 11.

This arrangement provides an advantage in that the top part 12 of the projecting part 10 illustrated in FIG. 8 is able to prevent foreign material from intruding from the positive Z direction. In other words, the likelihood of water, dust, or the like intruding into the projecting part 10 can be further reduced compared with the projecting part 10 illustrated in FIG. 7D.

On the other hand, the projecting part 10 illustrated in FIG. 7D has an advantage in that the structure of a mold for use in injection molding can be simplified. The configuration in which the mouths of the vent holes 21 are formed only in the lateral surface of the outer circumferential part 11 as in the case of the projecting part 10 illustrated in FIG. 8 may require the use of a slide core for extracting a product from the mold. In contrast, the configuration in which the mouths are also formed in the surface of the top part 12 as in the case of the projecting part 10 illustrated in FIG. 7D does not require the use of a slide core.

With the above-noted arrangement, the waterproof enclosure 100 of the embodiment enables easy discharge of water attached to the surface of the waterproof filter 3. Specifically, the waterproof enclosure 100 is provided with the projecting part 10 having the vent holes 21a through 21d connecting the penetrating hole 20 to outside space. The sloping surface parts 15 extending at an angle from the outer face 1s of the cover 1 toward the penetrating hole 20 delimit the respective vent holes as illustrated in FIG. 4C. With this arrangement, water accumulated inside the projecting part 10 is readily discharged to the outside through routine use of a two wheel vehicle regardless of the position in which the waterproof enclosure 100 is mounted to the two wheel vehicle. Considerable latitude is thus allowed with respect to mounting position.

The waterproof enclosure 100 may preferably be configured such that the vent holes 21a through 21d face outwardly in a radial manner along the outer face 1s of the cover 1 from the center of the projecting part 10 as illustrated in FIG. 1. With this arrangement, tilting the two wheel vehicle in any direction causes water accumulated inside the projecting part 10 to be discharged to the outside through one or two of the four vent holes 21a through 21d. Water accumulated inside the projecting part 10 can thus be more readily discharged.

The waterproof enclosure 100 may preferably be configured such that the two passages OP1 and OP2 formed between the outer circumferential part 11 and the inner circumferential part 13 of the projecting part 10 to face each other connect the penetrating hole 20 to the vent holes 21 as illustrated in FIGS. 7C and 7D. With this configuration, foreign materials coming from the outside is prevented from reaching, or readily reading, the penetrating hole 20.

The waterproof enclosure 100 may preferably be configured such that coverage provided by the cover parts 14 overlap the orthogonal projection of the mouths of the vent holes 21 onto the surface of the waterproof filter 3 as illustrated in FIG. 7B. With this configuration, foreign material intruding into the vent holes 21 can be prevented from coming in contact, or readily coming in contact, with the waterproof filter 3. Physical impact on and/or tearing of the waterproof filter 3 can thus be avoided.

The waterproof enclosure 100 may preferably be configured such that coverage provided by the cover parts 14 encompasses all the possible points at which imaginary lines passing through the mouths of the vent holes 21 could intersect directly with the surface of the waterproof filter 3. With this configuration, foreign material intruding into the vent holes 21 can be prevented from coming in contact with the waterproof filter 3 with increased reliability.

The waterproof enclosure 100 may preferably be configured such that the vent holes 21a through 21d face outwardly in the directions of arms of a Greek-cross shape along the outer face 1s of the cover 1 from the center of the projecting part 10. Arranging the vent holes evenly on the circumference prevents all the vent holes 21a through 21d from simultaneously clogging when a particular mounting position is employed. With this arrangement, the waterproof enclosure 100 enables the reduction of a risk of clogging caused by dust.

The waterproof enclosure 100 may preferably be configured such that the waterproof filter 3 is attached to the inner face of the cover 1. This arrangement provides an advantage in that the waterproof filter 3 is readily mounted to the cover 1.

The waterproof enclosure 100 may preferably be configured such that the inter faces of the outer circumferential parts 11 of the projecting part 10 are a flat plane shape or a curved shape bulging toward the center of the projecting part 10. This arrangement provides an advantage in that water accumulated inside the projecting part 10 is discharged to the outside with increased reliability even when the two wheel vehicle is tilted to place the midpoint between two adjacent vent holes at the lowest position as illustrated in FIG. 6B.

Embodiments of the present invention have been described heretofore. However, the present invention is not limited to these embodiments. Various modifications and replacements may be made to these embodiments without departing from the scope of the present invention.

For example, the embodiments described heretofore are directed to a configuration in which the outer appearance of the projecting part 10 is substantially a circular cylinder shape, with the four vent holes 21a through 21d being disposed substantially at the same distance from the center of the projecting part 10. The present invention is not limited to this configuration. For example, the outer appearance of the projecting part 10 may alternatively be a different shape such as a hemisphere shape, an elliptical cylinder shape, a prism shape, or the like. The vent holes 21 may be disposed at different distances from the center of the projecting part 10.

The embodiments described heretofore are directed to a configuration in which the four vent holes 21a through 21d have the same size. The present invention is not limited to this configuration. The vent holes 21 may have different mouth widths, different mouth shapes, or the like from each other.

Although the penetrating hole 20 is formed in the cover 1 in the embodiments described heretofore, the penetrating hole may alternatively be formed in the case 2, or two penetrating holes may be formed in the cover 1 and the case 2, respectively.

The embodiments described heretofore are directed to a configuration in which a plurality of vent holes 21 are connected to one penetrating hole 20 that is covered with one waterproof filter 3. The present invention is not limited to this configuration. For example, a plurality of penetrating holes 20 may be formed and connected to the vent holes 21, respectively, and may be covered with one waterproof filter 3. Alternatively, the penetrating holes 20 may be covered with respective waterproof filters 3.

The embodiments described heretofore are direction to a configuration in which the waterproof filter 3 is attached to the inner face (i.e., negative Z side) of the cover 1 such as to cover the penetrating hole 20 as illustrated in FIG. 3D. This arrangement provides an advantage in that the waterproof filter 3 is readily attached even in the case of the cover parts 14 having a complicated shape. The present invention is not limited to this configuration. For example, the waterproof filter 3 may be inserted and fit into the penetrating hole 20.

The embodiments descried heretofore are directed to a configuration in which each of the sloping surface parts 15 has one slope extending at an angle from the outer face is of the cover 1 toward the penetrating hole 20 as illustrated in FIG. 4C. The present invention is not limited to this configuration. For example, each of the sloping surface parts 15 may alternatively have a plurality of slopes connected in series and having respective, different sloping angles.

Although the waterproof enclosure 100 is mounted to a two wheel vehicle in the embodiments described heretofore, the waterproof enclosure 100 may as well be mounted to a motorcycle, a bicycle, an electric bicycle, a trike, a buggy, or the like, whose body is tilted while driving.

The present application is based on and claims the benefit of priority of Japanese priority application No. 2016-163003 filed on Aug. 23, 2016, with the Japanese Patent Office, the entire contents of which are hereby incorporated by reference.

What is claimed is:

1. A waterproof enclosure for enclosing an electronic component, comprising:
    an outer shell having a penetrating hole formed therethrough;
    a waterproof filter having air permeability and covering the penetrating hole; and
    a projecting part projecting from an outer surface of the outer shell and covering the penetrating hole,
    wherein the projecting part includes a plurality of vent holes connecting the penetrating hole to outside space,
    wherein each of the vent holes is delimited by a sloping surface extending at an angle from the outer surface toward the penetrating hole, and
    wherein the projecting part includes an outer circumferential part and an inner circumferential part which are concentric hollow cylinders, a space being formed between a lateral surface of the outer circumferential part and a lateral surface of the inner circumferential part, the lateral surface of the outer circumferential part having the vent holes formed therethrough, the lateral surface of the inner circumferential part facing the vent holes formed through the lateral surface of the outer circumferential part.

2. The waterproof enclosure as claimed in claim 1, wherein each of the vent holes is connected to the penetrating hole through two passages facing each other and formed between the outer circumferential part and the inner circumferential part.

3. The waterproof enclosure as claimed in claim 1, further comprising one or more cover parts disposed between the vent holes and the waterproof filter to cover part of a surface of the waterproof filter, wherein coverage provided by the one or more cover parts encompasses orthogonal projections of mouths of the vent holes onto the surface of the waterproof filter.

4. The waterproof enclosure as claimed in claim 1, further comprising one or more cover parts disposed between the vent holes and the waterproof filter to cover part of a surface of the waterproof filter, wherein coverage provided by the one or more cover parts encompasses any points at which imaginary lines passing through mouths of the vent holes intersect the surface of the waterproof filter.

5. The waterproof enclosure as claimed in claim 1, wherein the vent holes face outwardly in a radial manner from a center of the projecting part along the outer surface.

6. The waterproof enclosure as claimed in claim 1, wherein the vent holes are four vent holes facing outwardly in directions of arms of a cross shape from a center of the projecting part along the outer surface.

7. The waterproof enclosure as claimed in claim 1, wherein the waterproof filter is attached to an inner surface of the outer shell.

8. The waterproof enclosure as claimed in claim 1, wherein the outer circumferential part of the projecting part has an inner face that is a flat plane shape or a curved shape bulging toward a center of the projecting part.

9. A waterproof enclosure, comprising:
    an outer shell having a penetrating hole formed through an upper surface thereof;
    a waterproof filter covering the penetrating hole; and
    a projecting part projecting upwardly from the upper surface of the outer shell and covering the waterproof filter,
    wherein the projecting part includes a plurality of vent holes connecting the penetrating hole to outside space,
    wherein each of the vent holes has a bottom surface thereof extending at an angle relative to a surface of the waterproof filter, and
    wherein the projecting part includes an outer circumferential part and an inner circumferential part which are concentric hollow cylinders, a space being formed between a lateral surface of the outer circumferential part and a lateral surface of the inner circumferential part, the lateral surface of the outer circumferential part having the vent holes formed therethrough, the lateral surface of the inner circumferential part facing the vent holes formed through the lateral surface of the outer circumferential part.

\* \* \* \* \*